United States Patent [19]

Gies

[11] 4,345,164
[45] Aug. 17, 1982

[54] TRANSISTOR SWITCH WITH TWO CONTROL INPUTS

[75] Inventor: Johannes Gies, Holzkirchen, Fed. Rep. of Germany

[73] Assignee: Siemens Aktiengesellschaft, Berlin & Munich, Fed. Rep. of Germany

[21] Appl. No.: 94,823

[22] Filed: Nov. 16, 1979

[30] Foreign Application Priority Data

Nov. 22, 1978 [DE] Fed. Rep. of Germany ....... 2850653

[51] Int. Cl.³ .......................... H03K 1/12; H03K 3/01
[52] U.S. Cl. .................................... 307/255; 307/270; 307/313; 307/300
[58] Field of Search ............... 307/300, 255, 270, 313, 307/254, 296; 330/263, 265, 267

[56] References Cited

U.S. PATENT DOCUMENTS

| | | | |
|---|---|---|---|
| 3,441,864 | 4/1969 | Hafler | 330/263 |
| 3,600,696 | 8/1971 | Grandmont | 330/265 |
| 3,868,519 | 2/1975 | Green | 307/270 |
| 3,983,321 | 9/1976 | Vandling | 307/254 |
| 4,167,708 | 9/1979 | Goto | 330/267 |
| 4,205,273 | 5/1980 | Yoshida | 330/267 |

FOREIGN PATENT DOCUMENTS 2233612 1/1974 Fed. Rep. of Germany ...... 307/255

OTHER PUBLICATIONS

IBM Tech. Disclre. Bttn., High-Speed Bidirectional Circuit by E. S. Hoyt, vol. 19, No. 2, 7/76, pp. 416 and 417.

Primary Examiner—Stanley D. Miller, Jr.
Assistant Examiner—B. P. Davis
Attorney, Agent, or Firm—Hill, Van Santen, Steadman, Chiara & Simpson

[57] ABSTRACT

A transistor switching circuit is disclosed employing complimentary switching transistors which selectively connect either of two voltages to an output which is common to both switching transistors. Each of the switching transistors is driven by a constant current source. A diode is provided between a base and a collector of each of the switching transistors and the diode is positioned such that its polarity corresponds to the polarity of the base-collector junction of the respective switching transistor. A variable resistor may also be provided between the commonly connected bases and emitters of the switching transistors. Furthermore, the bases of the switching transistors may be coupled to the resistance by further diodes and each constant current source may also include a further transistor whose collector output connects to the input of the other current source.

11 Claims, 5 Drawing Figures

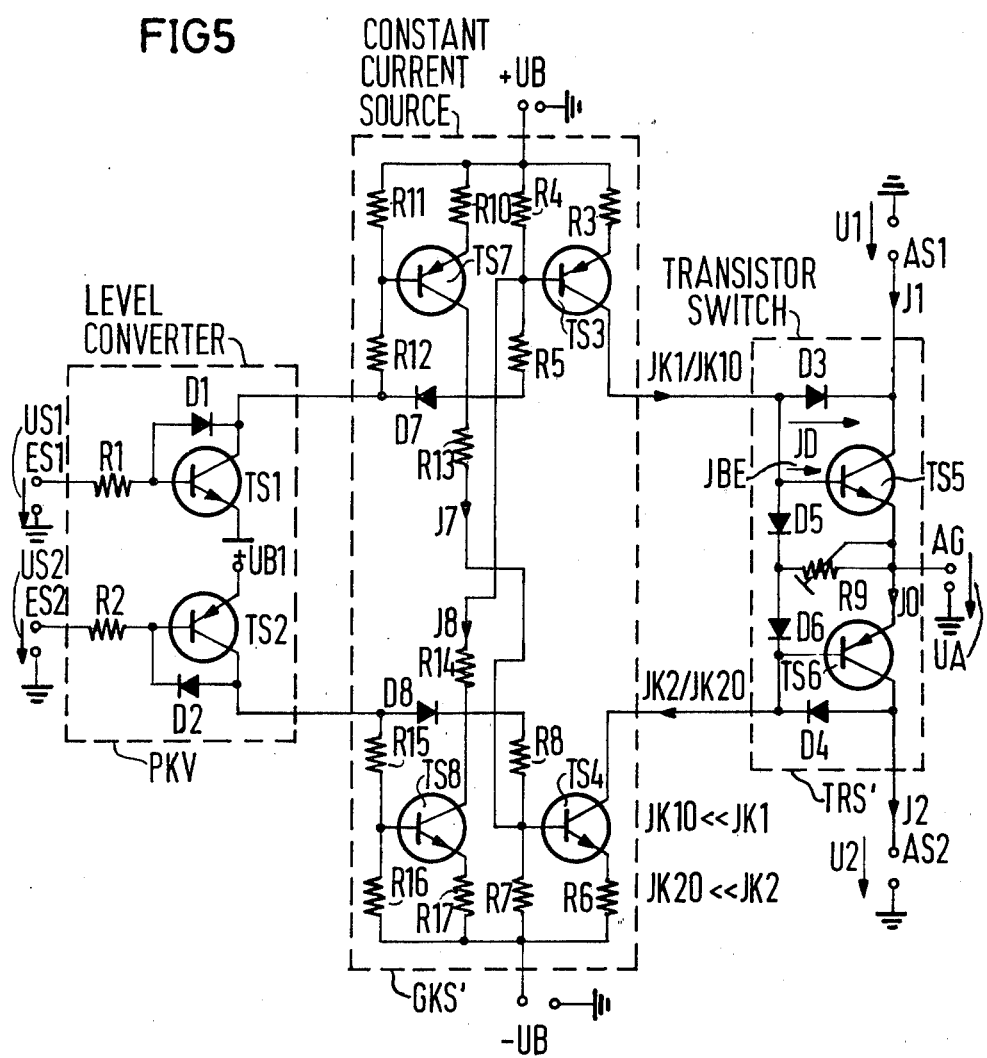

TRANSISTOR SWITCH WITH TWO CONTROL INPUTS

BACKGROUND OF THE INVENTION

The invention relates to a transistor switch with two control inputs, two transistors, and two supply voltage sources of different polarity which can be respectively connected to the transistors. The outputs of these transistors are in turn connected to the base control inputs of second switching transistors, the emitters of which are connected together to a common output and the collectors of which are connected across a voltage to be applied through these transistors to the output.

A transistor switch of this kind is known from the German AS No. 2,206,947, incorporated herein by reference. There, the transistors represent a two stage push-pull amplifier with complementary transistors, whereby the first transistor stage operates with a common load resistor via which the base contacts of the output side transistors are connected with one another.

From German OS No. 2,534,026, incorporated herein by reference, a device for the controlled switching of signals is known wherein a pulse control device releases rectangular-shaped control pulses to two control transformers. With the secondary side of these control transformers, in each case a first transistor is connected which functions as a switching transistor. To each of these first switching transistors a further transistor is connected such that one is connected with its collector to the positive terminal of a first supply voltage source and the other is connected with its emitter to the negative terminal of a second supply voltage source. The emitter, or respectively, collector of the two further transistors is connected to a first input of a synchronous motor, and a second input of the motor is connected to the negative pole of the first supply voltage source and to the positive pole of the second supply voltage source. The two transistor pairs form in each case a Darlington circuit whereby the connected transistors are reliably controlled in complete saturation. The collector-emitter path of the two further transistors are bridged in each case by a diode which protects the associated transistors against overload. This known circuit functions as a facsimile sender or a facsimile receiver containing a pivotably mounted drum which, by use of a synchronous motor, performs a scanning movement over different positions between a document placed around the drum and a converter.

SUMMARY OF THE INVENTION

It is an object of the present invention with a transistor switch of the kind mentioned above, to switch two voltages through to a common output and wherein the voltages are as low in resistance as possible and have a slight offset. According to the invention, this is attained in that the base-collector paths of the two switching transistors, whose base-control inputs are parallel connected, each have a diode parallelly connected to them, the polarity of which corresponds to that of the associated base-collector path.

The two switching transistors function, together with the diodes, as two electronic switches which permit the switching through, to the common output, of one of the two voltages in each case with low resistance largely independent of the load and with slight offset to the common output. If, on the other hand, both switches are open, then the output is high resistance ("tri-state").

BRIEF DESCRIPTION OF THE DRAWINGS

FIG. 5 illustrates a further embodiment of a transistor switch according to the invention.

DESCRIPTION OF THE PREFERRED EMBODIMENTS

Figure 1:
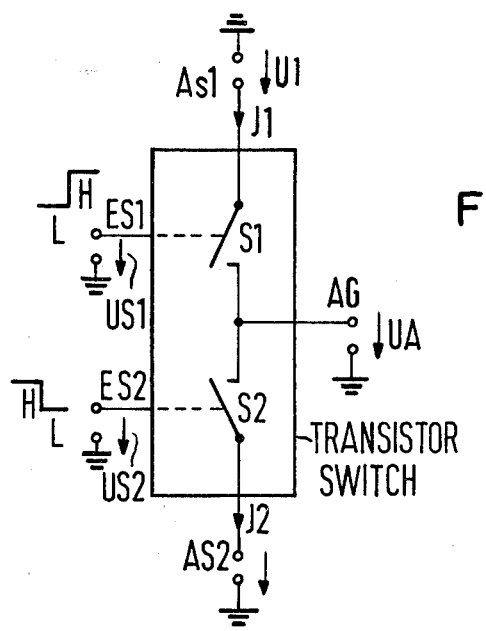
FIG. 1 illustrates the manner of construction of a known transistor switch in a block diagram.

In the principal diagram according to FIG. 1, two inputs ES1 and ES2 are provided for two control voltages US1 and US2. These control voltages can assume two different switching states, namely either L ("low") or H ("High"). Only one of the two control voltages at a given point in time is at L. The two control voltages US1, or respectively, US2 are supplied to a transistor switch TRS, the construction of which is represented in greater detail in FIGS. 2 and 5. At this transistor switch, two voltages U1, or respectively, U2 are applied. In accordance with the switching state of the control voltages US1 or US2, in each case one of the voltages U1 or U2 is selectively connected through to the output AG and there it provides the output voltage UA.

The circuit TRS contains a first switch S1 which is activated in dependence upon the logic state of the control voltage US1. Therefore, switch S1 is closed if the control voltage US1 displays the value H, whereas switch S1 remains open if the switching state L of the control voltage US1 is present. The behavior is reversed for the opening or closing of the second switch S2 with respect to the control voltage US2. That is, in the case of US2 at L, the switch S2 is closed and in the case of US2 at H, S2 is open. If the switch S1 is closed, then a current I1 flows through it, whereas in the case of a closed switch S2, a current I2 flows through the switch S2 to the output AG. If the voltage US1 lies at L and at the same time US2 lies at H, then both switches S1 and S2 are open, and the output AG is high resistance ("tri-state").

Figure 2:
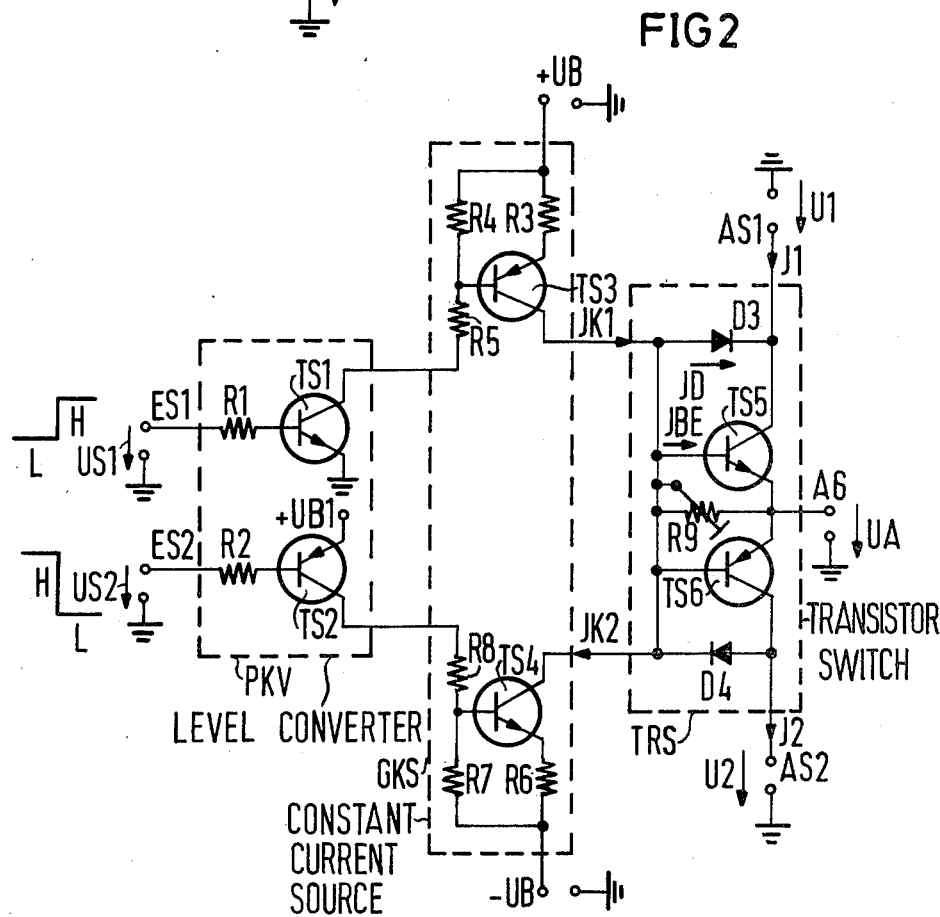
FIG. 2 illustrates a first embodiment of a transistor switch according to the invention.

In the case of the circuitry arrangement according to FIG. 2, the two control voltages US1, or respectively, US2 are fed first to a level converter PKV which in each case contains a transistor stage having transistors TS1 or TS2. The selection of the transistor TS1 proceeds by means of the control voltage US1 via a resistor R1 which is connected to the base. The emitter is at ground potential and the collector is connected with the constant current source GKS. In the case of transistor TS2, the selection of the base proceeds by means of the control voltage US2 via resistor R2. A positive operating voltage UB1 is applied to the emitter of the transistor TS2, while the collector is connected to the constant current source GKS.

The two transistors TS1 and TS2 serve as a level converter for creating suitable selection voltages for the constant current sources GKS which are connected thereafter and formed by the transistors TS3 and TS4 and the associated resistors. It should be noted that the transistor TS3 is at a supply voltage +UB and the transistor TS4 is at a supply voltage −UB.

In the upper part of the connected constant current sources GKS, a supply voltage +UB is connected via a resistor R3 at the emitter of a switchable transistor TS3. At +UB a further resistor R4 is branched off and connected with the base of the transistor TS3. A resistor R5 is connected between the collector of the transistor TS1 of the level converter PKV and the base of the transistor TS3. In accordance with the switching position of the transistor TS1, and therefore in accordance with the position L or H of the control voltage US1, the base of the switchable transistor TS3 is supplied with a potential such that it is either open (position H of the control voltage US1 with constant output current JK1) or closed (position L of the control voltage US1).

The base of the second switchable transistor TS4 is connected via a resistor R8 to the collector of the transistor TS2 and is connected at its emitter via a resistor R6 with −UB of the supply voltage source. Between −UB and the base of the transistor TS4, there lies a further resistor R7. The constant current sources which are connected as such in the form of transistors TS3 and TS4 deliver currents JK1, or respectively, JK2, which are equally large in magnitude but which flow in opposing directions.

The actual transistor switch TRS includes the two switching transistors TS5 and TS6 to whose collectors the voltage which is to be connected through (either U1, or respectively, U2) is applied. The emitters of the switching transistors TS5 and TS6 are connected with one another and are connected to an output terminal AG which outputs the output voltage UA. The collectors of the two transistors TS3 and TS4 are connected with one another and, besides this, are directed to the base in each case of the two switching transistors TS5 and TS6. The emitters of the switching transistors TS5 and TS6 are connected over an adjustable resistor R9 with the base.

A diode D3, or respectively, D4 is connected in between the collector of the switching transistors TS5 and TS6 and the associated base. The diode D3 is poled in a conducting direction with reference to the constant current JK1, and the diode D4 is poled in a conducting direction with reference to the constant current JK2. For diodes D3, or respectively, D4, it is practical to use a low threshold voltage type (for example 0.4 volts at 1 milliamp). Accordingly, a regulating mechanism results which accommodates the base current of the switching transistor TS5, or respectively, TS6 automatically to the load drop. At no-load at output AG, little base current flows via the switching transistor TS5, or respectively, TS6. In the case of a full load a strong base current JBE flows. It is possible to greatly shorten the storage time in the case of switching off of the switching transistor TS5, or respectively, TS6, without giving up the low resistance condition at load. Therefore it results that the circuit at the output terminal AG always represents a low ohm voltage source.

Figure 3:
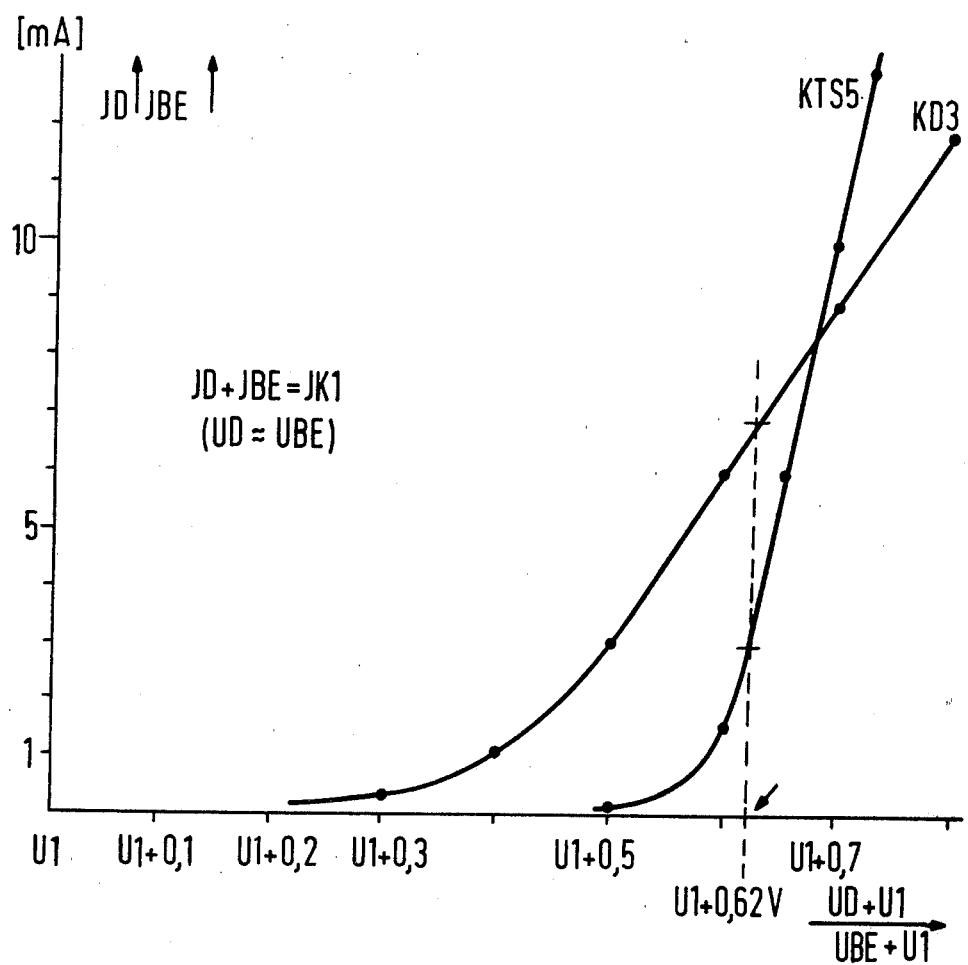
FIG. 3 illustrates a characteristic curve for noload operation.

For explanation of the regulating process, reference is made to FIG. 3, where, on the Abscissa, the voltage UD+U1 for the diode D3, or respectively, UBE+U1 is represented. UBE represents the base-emitter voltage of the switching transistor TS5. On the ordinate, the current JD for Diode D3, or respectively, the base-emitter current JBE of the switching transistor TS5 is shown. The characteristic curve for the diode D3 is designated KD3, and the characteristic curve for the switching transistor TS5 is designated KTS5. The operating point for diode D3 and the switching transistor TS5 is assumed at the voltage value U1+0.62 volts. For switching transistor TS5, at this operating point a current of JBE=3 mA results. A current JD=7 mA flows through the diode D3 for the assumed operating point. The following relationship applies: JD+JBE=JK1=7 mA+3 mA=10 mA.

The resistance R9 is assumed to be very large and the diode voltage UD is assumed to be approximately equal to the voltage UDE of the transistor TS5.

Figure 4:
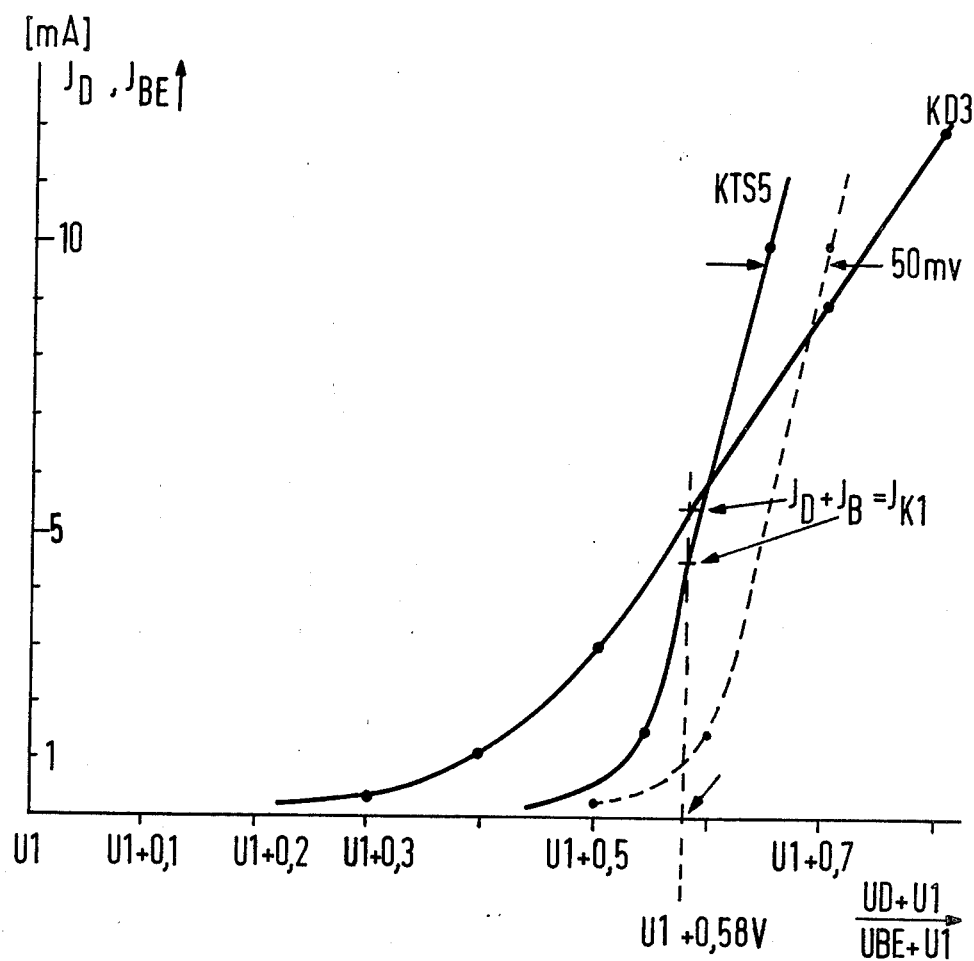
FIG. 4 illustrates a characteristic curve for load operation.

The current JK1 of the constant current source GKS is selected to be so high that it alone would control or swing the diode D3 up to an emitter diode voltage UD of approximately 0.8 volts. With switching in of current JK1, that is, with opening of the switchable transistor TS3, the emitter of the switching transistor TS5 follows the base voltage until the emitter has almost attained the collector potential U1. Only then is UBE approximately equal to UD and a higher base current flows, since also the base-collector diode of the switching transistor TS5 opens. Transistor TS5 is thus operated in saturation. Accordingly, the base-emitter voltage UBE is less than or equal to UD, since the emitter potential can even become somewhat higher than the voltage U1. In the case of the load represented in FIG. 4, the characteristic curve for the characteristic KD3 of the diode D3 is unchanged. In contrast to this, the characteristic KTS5 for the switching transistor TS5 is displaced to the left and indeed by a value of approximately 50 mV. This is brought about since by means of the larger load current J1 which flows through the collector-emitter path of transistor TS5, a larger voltage drop also occurs at the inner resistance of this collector-emitter path. This voltage drop has a value of approximately 50 mV. It therefore results that the characteristic KTS5 is displaced toward the left by the above-mentioned value of 50 mV. However, for the new operating point U1+0.58 V, a diode current arises which now only has the value JD=5.5 mA, so that a decrease of 1.5 mA with respect to the operating situation specified in FIG. 4 has occurred. In contrast to this, the base current JBE, by means of switching transistor TS5, has grown from 3 to 4.5 mA. Thus, in case of a load, altogether there results a current of JD+JBE=5.5 mA+4.5 mA=10 mA=JK1 which does not deviate from the no load situation according to FIG. 4.

By means of different steepnesses of the two characteristics KD3 and KTS5, as well as by means of a suitable selection of the threshold voltage of diode D3, different regulating characteristics can be realized. By means of partial short circuiting of the base current with the adjustable resistor R9, the level of saturation and thus the low resistance condition, and also the switch off-time constants can be adjusted.

The two voltages U1 and U2 which are to be connected through with low resistance, and with slight offset to the output AG, may lie in the range +UB->U1≧U2>−UB.

For the lower part of the circuit according to FIG. 2, thus for transistors TS4 and TS6, as well as the associated switching elements, the above considerations apply in analogous fashion.

In the case of the embodiment from according to FIG. 5, the level converter PKV is constructed as in the case of the arrangement according to FIG. 2. In the area of the switchable constant current sources GKS', in addition to the switchable transistor TS3 a further transistor TS7 is provided, and in addition to the switchable transistor TS4 a second transistor TS8 is provided. The base of the transistor TS7 is selected by the collector of the transistor TS1 via a resistor R12, whereas the connection of the emitter procedes via resistor R10 to the voltage source +UB. Between the outer connection of the resistor R10 and the base of transistor TS7, a resistor R11 is provided. Furthermore, in front of the input of resistor R5 which is connected to the base of transistor TS3, a diode D7 is connected.

The lower part of the circuit is constructed in analogous fashion and contains the diode D8 as well as resistors R15, R16 and R17. The collector side output of the additional transistor TS7 is connected via a resistor R13 to the base of transistor TS4 which lies on the other side. Here, the current J7 flows. Further, a connection exists from the base of transistor TS3 via a resistor R14 to the collector of the transistor TS8. The current which flows there is designated J8.

The construction of the transistor switch TRS' which contains the switching transistors TS5 and TS6, is changed with respect to FIG. 2 only in that between the base connection of the switching transistor TS5 and the following connection to be adjustable resistor R9, a diode D5 is connected, and further, between resistor R9 and the base of the switching transistor TS6, a further diode D6 is connected.

Here, too, three switching states are possible:

(1) the switching through of voltage U1 to the output;
(2) the switching through of voltage U2 to the output AG; (3) the simultaneous separation or isolation of the two voltages U1 and U2 from the output AG. If, for example, the voltage U1 is connected to the output AG, then this connecting through procedes such as is described in FIG. 2 and the characteristic configuration which is represented in FIG. 3, or respectively, FIG. 4. The transistor TS5 is thus in load-dependent saturation and the constant current JK1 flows. Additionally however, in FIG. 5, at the same time as transistor TS3, the additional transistor TS7 also becomes conducting and its current J7 activates the base of the switchable transistor TS4 in weak fashion, so that a certain small current JK20 flows via the diodes D5 and D6. The value of current JK20 is dimensioned such that the following applies:

$$JK20 = JK10$$

$$JK20 << JK1$$

$$JK20 << JK2$$

Thereby, the following relationship applies:

$$JK1 = JD3 + JBE(TS5) + JR9 + JK20 \approx JD3 + JBE(TS5) + JR9.$$

The current JK20 switches the diodes D5 and D6 in a conducting direction. Since these diodes are selected such that the threshold voltage UD5 and UD6 are equal to the base-emitter threshold voltages of the transistors TS5 and TS6, the transistor TS6 opens somewhat and a small transverse current JO flows. Therefore, the switching stage consisting of the transistors T5 and T6 is low resistance in all four U/J-Quadrants.

The diodes D7 and D8 serve for the uncoupling of the current sources connected through by transistors TS3 and TS7, or respectively, TS4 and TS8. If both switching inputs are blocked by suitable control voltages U1 and U2, then also all current sources are blocked and the switching stage procedes into the high resistance state ("tri-state").

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A transistor switch circuit, comprising: two control inputs respectively connected to two first transistors; two supply voltage sources of different polarity which are respectively supplied to a respective one of the transistors; outputs of the transistors respectively connecting to parallel connected base control inputs of two switching transistors; emitters of the switching transistors being connected to a common output; each of the collectors of the switching transistors being directly connected to a respective voltage source to be connected to the output by and through the respective switching transistor; and a first diode connected in parallel across the base-collector path of each of the two switching transistors, a polarity of the first diode being aligned to correspond to a polarity of the associated switching transistor base-collector path, whereby the switching transistors with the associated diodes provide a low resistance path from the respective voltage source to the output independent of load variations.

2. A transistor switch circuit according to claim 1 wherein each of the first transistors form a constant current source, the respective supply voltage source is applied to an emitter of the respective first transistor, and output selection occurs by coupling the control inputs to a base of the respective first transistor.

3. A transistor switch circuit according to claim 2 wherein a second transistor is provided with each of the constant current sources, the second transistor emitter being coupled to the same supply voltage source as the first transistor, its base being coupled to the same control input, and its collector being coupled with the base of the other first transistor of the other constant current source.

4. A transistor switch circuit according to claim 3 wherein between the bases of the second transistors and the bases of the first transistors a diode is positioned to be operated in a conducting direction with respect to the polarity of the associated supply voltage source.

5. A transistor switch circuit according to claim 1 wherein between the common output and a common coupling to the bases of the two switching transistors a resistance is provided.

6. A transistor switch circuit according to claim 5 wherein the resistance is adjustable.

7. A transistor switch circuit according to claim 5 wherein between each of the bases of the switching transistors and the resistance in each case a second diode is connected which is poled in a conducting direction for current from the respective first transistor.

8. A transistor switch circuit according to claim 1 wherein in front of an input of the two first transistors a level converter means is provided for connecting two control voltages of the control inputs to the first transistors.

9. A transistor switch circuit according to claim 1 wherein the first diode associated with each switching transistor has a relatively low threshold voltage relative to the switching transistor associated therewith.

10. A transistor switch circuit, comprising: first and second supply voltages of opposite polarity; a pair of control means for supplying two control currents; a pair of complementary switching transistors having their emitters directly coupled to a common output and their collectors directly coupled to respective third and fourth voltages to be coupled directly through the respective switching transistors to the common output; respective bases of the switching transistors being connected to one of the respective control means; and a diode associated with each switching transistor coupled between a base and a collector of the respective switching transistor and being poled so as to correspond to the base-collector junction of the associated transistor, the diode having characteristics chosen such that the combination of the diode and the associated switching transistor provides a low resistance path from the respective supply voltage to the output substantially independent of substantial changes in the load.

11. The circuit of claim 10 wherein the bases of the switching transistors are coupled together and a resistance is provided between a junction between the bases and a junction between the emitters of the switching transistors.

* * * * *